(12) United States Patent
Park et al.

(10) Patent No.: US 10,541,286 B2
(45) Date of Patent: Jan. 21, 2020

(54) ORGANIC LIGHT EMITTING DISPLAY DEVICE

(71) Applicant: LG Display Co., Ltd., Seoul (KR)

(72) Inventors: Hyemin Park, Goyang-si (KR); Hunki Shin, Paju-si (KR); Dongik Kim, Goyang-si (KR); Jinwoo Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 163 days.

(21) Appl. No.: 15/697,024

(22) Filed: Sep. 6, 2017

(65) Prior Publication Data

US 2018/0083078 A1 Mar. 22, 2018

(30) Foreign Application Priority Data

Sep. 22, 2016 (KR) ........................ 10-2016-0121665

(51) Int. Cl.
*H01L 27/32* (2006.01)
*H01L 29/423* (2006.01)
*H01L 51/10* (2006.01)

(52) U.S. Cl.
CPC ...... *H01L 27/3248* (2013.01); *H01L 27/3262* (2013.01); *H01L 29/42312* (2013.01); *H01L 51/102* (2013.01); *H01L 27/3211* (2013.01)

(58) Field of Classification Search
CPC ... G09G 2300/0819; G09G 2310/0205; G09G 2310/0297; G09G 2320/0295;
(Continued)

(56) References Cited

U.S. PATENT DOCUMENTS 6,448,718 B1 9/2002 Battersby
8,816,998 B2 8/2014 Pyon et al.
(Continued)

FOREIGN PATENT DOCUMENTS

CN 1667681 A 9/2005
CN 100547637 C 10/2009
(Continued)

OTHER PUBLICATIONS

European Search Report, dated Jan. 25, 2018 for the European patent application No. 17192455.8.
(Continued)

*Primary Examiner* — Tony O Davis
(74) *Attorney, Agent, or Firm* — Polsinelli PC

(57) ABSTRACT

The present disclosure relates to an organic light emitting display device which comprises a plurality of sub-pixels each of which comprises an OLED, a driving TFT, a first TFT for applying a data voltage to a gate electrode of the driving TFT, a second TFT for applying a reference voltage to a source electrode of the driving TFT, and a storage capacitor, a data driver for outputting the data voltage to a data line and the reference voltage to a reference line, and a gate driving unit for outputting signals to a first gate line connected to the gate electrode of the first TFT and a second gate line connected to the gate electrode of the second TFT, wherein two adjacent sub-pixels emitting a same color is supplied with the data voltages through different data lines and share the first gate line and the second gate line.

20 Claims, 13 Drawing Sheets

(58) Field of Classification Search
CPC .............. G09G 3/3233; H01L 27/3211; H01L 27/3248; H01L 27/3262; H01L 29/42312; H01L 51/102
USPC .............................................. 345/76, 82, 690
See application file for complete search history.

(56) References Cited

U.S. PATENT DOCUMENTS

| | | | | |
|---|---|---|---|---|
| 2009/0207104 | A1* | 8/2009 | Lee | G09G 3/3275 345/76 |
| 2009/0243498 | A1* | 10/2009 | Childs | G09G 3/3233 315/169.3 |
| 2011/0221789 | A1* | 9/2011 | Ota | H01L 27/3267 345/690 |
| 2012/0313903 | A1 | 12/2012 | Pyon et al. | |
| 2013/0147694 | A1* | 6/2013 | Kim | G09G 3/32 345/82 |
| 2014/0111406 | A1 | 4/2014 | Wang et al. | |
| 2015/0062192 | A1* | 3/2015 | Kim | G09G 3/3291 345/690 |
| 2015/0179102 | A1 | 6/2015 | Kim et al. | |
| 2015/0187278 | A1* | 7/2015 | Park | G09G 3/3291 345/212 |
| 2015/0187328 | A1* | 7/2015 | Kim | G09G 5/02 345/690 |
| 2015/0356899 | A1* | 12/2015 | Yamanaka | G09G 3/3225 345/690 |
| 2016/0078813 | A1* | 3/2016 | Mizukoshi | G09G 3/3283 345/76 |
| 2016/0098960 | A1* | 4/2016 | Park | G09G 3/3233 345/205 |
| 2016/0125798 | A1 | 5/2016 | Park et al. | |
| 2016/0155385 | A1* | 6/2016 | Yang | G09G 3/3233 345/174 |
| 2016/0204165 | A1* | 7/2016 | Yang | H01L 27/323 345/174 |
| 2018/0083078 | A1* | 3/2018 | Park | H01L 27/3248 |

FOREIGN PATENT DOCUMENTS

| | | |
|---|---|---|
| CN | 102968954 A | 3/2013 |
| CN | 103871359 A | 6/2014 |
| CN | 103969900 A | 8/2014 |
| CN | 104658476 A | 5/2015 |
| CN | 104732918 A | 6/2015 |
| CN | 104751793 A | 7/2015 |
| CN | 105742312 A | 7/2016 |
| CN | 105761677 A | 7/2016 |
| CN | 105810173 A | 7/2016 |
| EP | 1 764 772 A2 | 3/2007 |

OTHER PUBLICATIONS

Chinese Office Action dated Nov. 4, 2019 issued in corresponding Application No. 201710832856.9 (23 pages).

* cited by examiner

ORGANIC LIGHT EMITTING DISPLAY DEVICE

CROSS-REFERENCE TO RELATED APPLICATION

This application claims the benefit of priority under 35 U.S.C. § 119(a) to Korean Patent Application No. 10-2016-0121665 filed on Sep. 22, 2016, which is incorporated by reference herein in its entirety.

BACKGROUND

Field of the Disclosure

The present disclosure relates to a display device, and more particularly, to an organic light emitting display capable of compensating for characteristics of the driving TFTs driving organic-emitting pixels in a structure in which the pixels shares gate lines.

Description of the Background

An active matrix type organic light emitting display is an organic light emitting diode (hereinafter, referred to as "OLED") which emits light by itself, and has advantages in fast response, high light emitting efficiency, high brightness, and wide viewing angle.

An organic light emitting display device includes pixels each including an OLED and a driving TFT (Thin Film Transistor) in a matrix form, and adjusts the luminance of an image implemented in a pixel according to gradation of video data. The driving TFT controls the driving current flowing in the OLED according to the voltage applied between the gate electrode and the source electrode of the driving TFT. The emission amount of the OLED is determined according to the driving current, and the brightness of the image is determined according to the emission amount of the OLED.

When the driving TFT operates in the saturation region, the pixel current flowing from the drain to the source of the driving TFT changes depending on the electrical characteristics of the driving TFT, such as a threshold voltage and an electron mobility. The electrical characteristics of the driving TFTs vary between pixels due to various causes such as process characteristics and time-varying characteristics, and thus even if the same data voltage is applied to pixels having different electrical characteristics of TFTs, luminance deviations can occur between the pixels. So, unless the characteristic deviations are compensated, it is difficult to realize images with desired quality.

In order to solve such a problem, there has been proposed a technique of compensating for a luminance deviation due to a deviation of electrical characteristics (e.g., threshold voltage, mobility) of driving TFTs within pixels and/or outside pixels. An internal compensation manner has a disadvantage that a pixel structure is complicated and an aperture ratio becomes low. On the other hand, an external compensation manner, which senses the characteristic parameters of the driving TFTs of individual pixels and corrects input data according to the sensing values, takes a long time for sensing.

Recently, a hybrid compensation manner has been proposed in which a pixel structure is simplified and a sensing time is reduced by compensating the luminance non-uniformity due to the threshold voltage deviation of the driving TFTs by the external compensation manner, and compensating the luminance non-uniformity due to the mobility deviation of the driving TFTs by the internal compensation manner.

Meanwhile, as the resolution of a mobile device such as a smart phone increases, the number of pixels increases compared to a panel size, which results in the problems such as a complicated pixel structure and a reduction in free space in a bezel. In order to solve these problems, there is a tendency to adopt a structure, for reducing the number of channels of a source drive IC (Integrated Circuit), in which gate lines of a k-th line and a (k+1)-th line are shared and/or one channel supplies data voltages to two sub-pixels adjacent in a horizontal direction.

However, when the structure sharing gate lines or sharing a channel of a data driving circuit is applied to an organic light emitting display, the hybrid compensation scheme for solving the luminance non-uniformity problem inherent in the organic light emitting display cannot be realized.

SUMMARY

The present disclosure has been made in view of the above circumstances. Accordingly, the present disclosure is to provide an organic light emitting display device for solving the problem of luminance non-uniformity in the structure sharing gate lines or sharing a channel of a data driving circuit.

Another aspect of the present disclosure is to provide an organic light emitting display device for compensating a threshold voltage and a mobility of a driving TFT in the structure sharing gate lines or sharing a channel of the data driving circuit.

An organic light emitting display device according to an aspect of the present disclosure comprises: a display panel equipped with a plurality of sub-pixels each of which comprises an organic light emitting diode (OLED), a driving TFT for controlling a driving current flowing through the OLED, a first switch TFT for applying a data voltage to a gate electrode of the driving TFT, a second switch TFT for applying a reference voltage to a source electrode of the driving TFT, and a storage capacitor connected between the gate electrode and the source electrode; a data driving unit configured to output the data voltage to a data line connected to the sub-pixels, and output the reference voltage to a reference line connected to the sub-pixels; and a gate driving unit configured to output signals to a first gate line connected to the gate electrode of the first switch TFT and a second gate line connected to the gate electrode of the second switch TFT, wherein two adjacent sub-pixels emitting a same color are supplied with the data voltages through different data lines and share the first gate line and the second gate line.

An organic light emitting display device comprising a display panel including a plurality of pixels, each pixel including subpixels each having an organic light emitting diode (OLED), a driving TFT controlling a driving current flowing through the OLED, a first switch TFT applying a data voltage to a gate electrode of the driving TFT, a second switch TFT applying a reference voltage to a source electrode of the driving TFT, and a storage capacitor connected between the gate electrode and the source electrode of the driving TFT includes a data driving unit outputting the data voltage to a data line connected to the sub-pixels, and outputting the reference voltage to a reference line connected to the sub-pixels; and a gate driving unit outputting signals to a first gate line connected to the gate electrode of the first switch TFT and a second gate line connected to the gate electrode of the second switch TFT; a timing controller temporally separating a sensing driving from a display driving, wherein the sensing driving senses driving characteristics of the sub-pixels and updating compensation values according to the sensed characteristics and the display driving displays the input image reflecting the compensation values according to a predetermined control sequence, wherein the first gate line controls supply of the data voltage and the second gate line controls the reference voltage, and two adjacent sub-pixels emitting a same color are supplied with the data voltage through different data lines and share the first and second gate lines to compensate for a driving characteristic of the driving TFT of the sub-pixels.

In an aspect, two adjacent sub-pixels emitting different colors may be supplied with the data voltages though a same channel.

In an aspect, the data driving unit may comprise a demux switching unit including first, second, third and fourth demux switches, wherein when the data driving unit applies the data voltages output from the channel to the data lines, the first and second demux switches select one of the two adjacent sub-pixels emitting different colors and the third and fourth dumux switches select one of the two adjacent sub-pixels emitting the same color.

In an aspect, signals controlling the first and second demux switches may have a duty ratio of 50% and a period of one horizontal period and be in opposite phases to each other, and signals controlling the third and fourth demux switches may have a duty ratio of 50% and a period of two horizontal periods and be in opposite phases to each other.

In an aspect, in order to compensate for a change of mobility of the driving TFT, a first scan signal applied to the first gate line may maintain on-level and a second scan signal applied to the second gate line may maintain off-level during a sensing period during which a source voltage of the driving TFT rises toward a data voltage applied to the gate electrode of the driving TFT, and the first and second scan signals may maintain off-level during an emission period during which the OLED emits light according to a driving current programmed in the sensing period.

In an aspect, the first and second scan signals may become the on-level in synchronization with a start of a first horizontal period, the first scan signal may become the off-level before a second horizontal period ends, and the second scan signal may become the off-level before the first scan signal changes to the off-level.

In an aspect, the data driving unit may comprise an initializing switch for supplying the reference voltage to the reference line, a switch for sampling a voltage of the source electrode as a sensing voltage when a predetermined voltage is applied to the gate electrode for an external compensation and then a current flows through the driving TFT, an analog-to-digital converter for converting the sampled sensing voltage into a digital sensing value and a digital-to-analog converter for converting digital data to be supplied to the sub-pixel into a data voltage.

In an aspect, the data to be supplied to the sub-pixel may be modulated based on the digital sensing value in order to compensate for a change of a threshold voltage of the driving TFT.

In an aspect, the change of the threshold voltage of the driving TFT may be detected in a non-display section immediately from when a driving power is applied to when an image is displayed or a non-display section immediately from when the image display ends to when the driving power is cut off, and the compensation of the change of the threshold voltage of the driving TFT and the change of the mobility of the driving TFT may be performed during an image display section.

Therefore, it becomes possible for neighboring sub-pixels in a data line advancing direction to share not only the gate line for providing the data voltage but also another gate line for sensing the threshold voltage of the driving TFT or providing an initial voltage, so the number of gate lines can be reduced and the bezel to which GIP for driving the gate lines is applied can be reduced.

In addition, it is possible to apply the hybrid compensation manner to a structure sharing the gate lines or sharing the channel of the data driving circuit, thereby solving the problem of the luminance unevenness.

Moreover, two adjacent sub-pixels emitting different colors share a channel, thereby reducing the number of output channels included in the source drive IC, reducing the number of source drive ICs included in the data driver circuit, and thus reducing the bezel.

BRIEF DESCRIPTION OF THE DRAWINGS

The accompanying drawings, which are included to provide a further understanding of the disclosure and are incorporated in and constitute a part of the present disclosure, illustrate aspects of the disclosure and together with the description serve to explain the principles of the present disclosure.

In the drawings.

DETAILED DESCRIPTION

Figure 1:
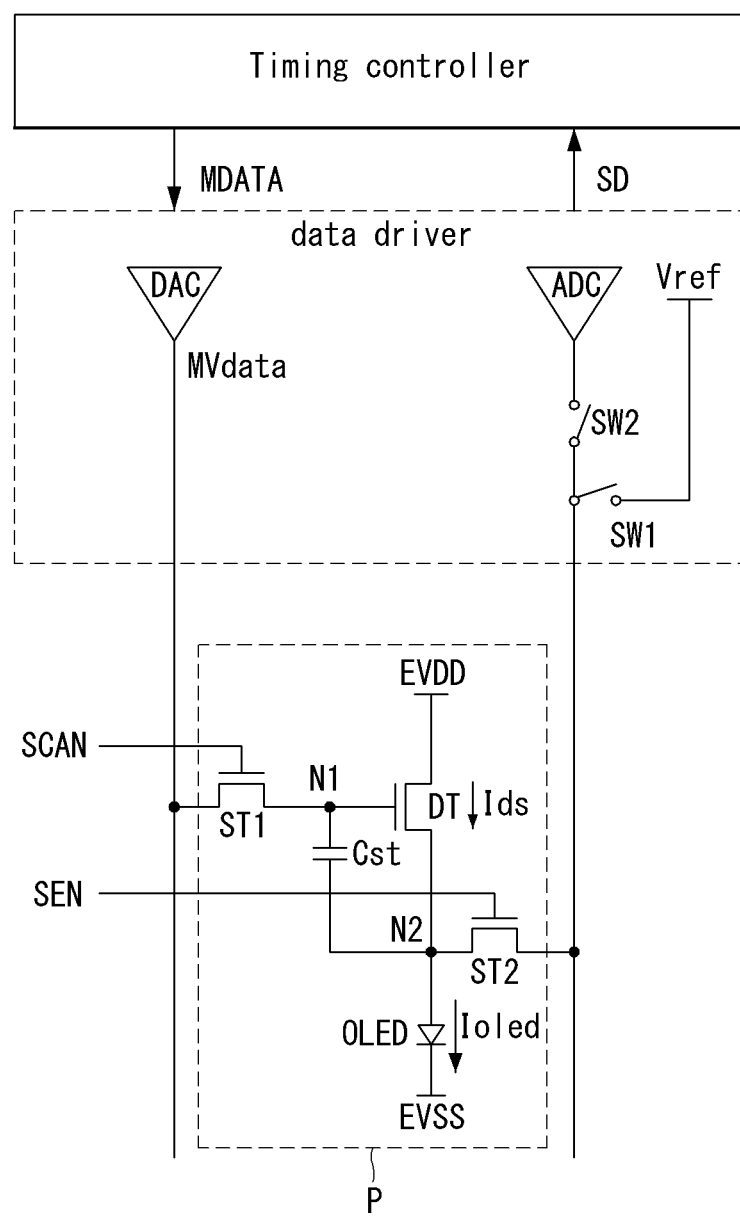
FIG. 1 shows an equivalent circuit of a sub-pixel to which a hybrid compensation scheme is applied and a data driving circuit.

Hereinafter, aspects of the present disclosure will be described in detail with reference to the accompanying drawings. Same reference numerals throughout the specification denote substantially identical components. In the following description, well-known functions or constructions related to the present disclosure are not described in detail since they would obscure the subject matter of the disclosure in unnecessary detail.

Figure 2:
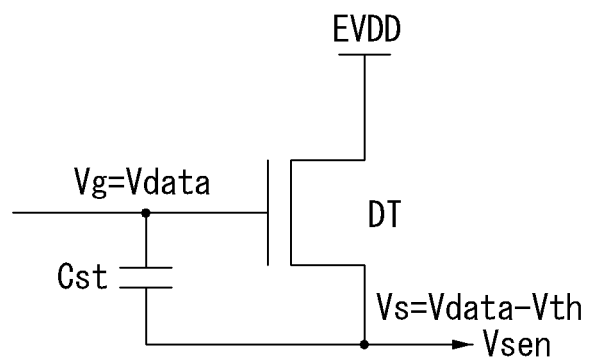
FIG. 2 illustrates a principle in which the threshold voltage change of a driving TFT is compensated.
Figure 2:
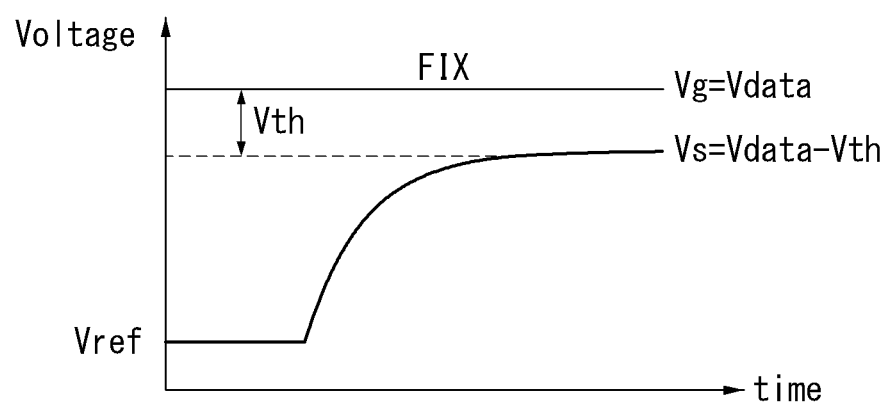
Figure 3:
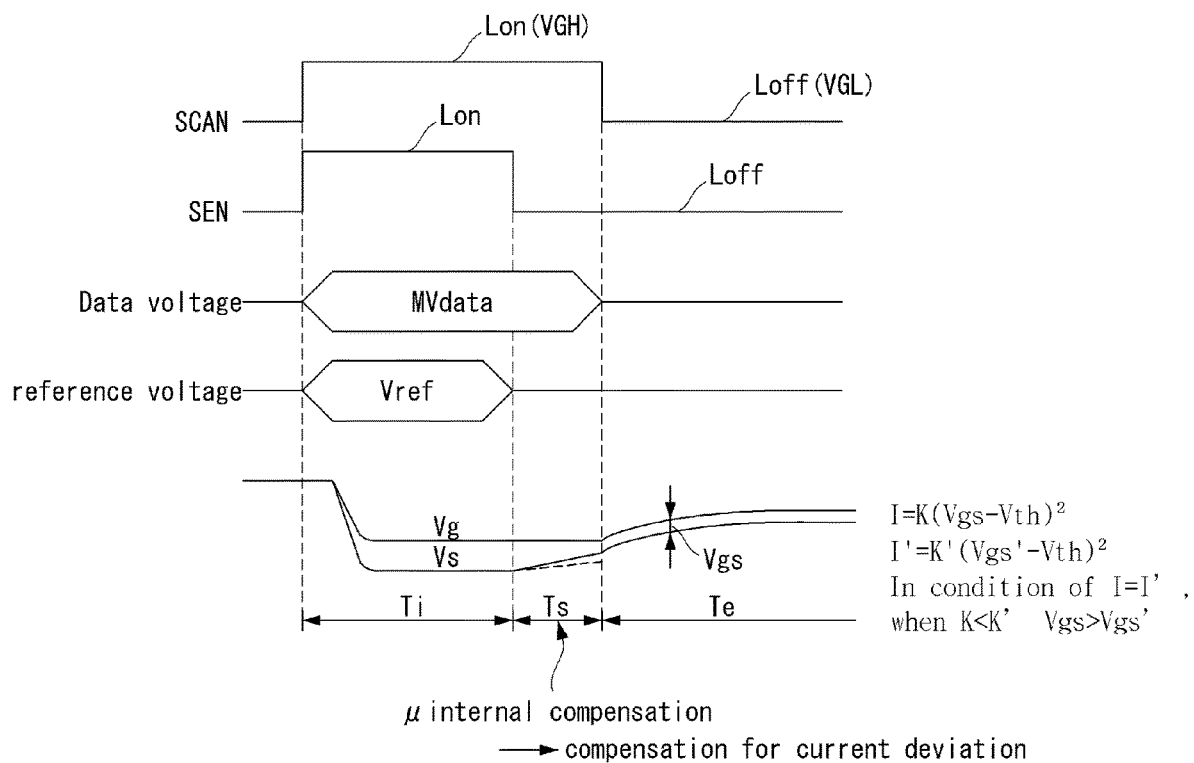
FIG. 3 is a view for explaining the principle of compensating for the mobility change of the driving TFT.

FIG. 1 shows an equivalent circuit of a sub-pixel to which a hybrid compensation scheme is applied and a data driving circuit, FIG. 2 illustrates a principle in which the threshold voltage change of a driving TFT is compensated, and FIG. 3 is a view for explaining the principle of compensating for the mobility change of the driving TFT.

Referring to FIG. 1, a subpixel or a pixel P for hybrid compensation may comprise an OLED, a driving TFT DT, a storage capacitor Cst, a first switch TFT ST1, and a second switch TFT ST2. The TFTs constituting the pixel P may be implemented as a p-type or an n-type. In addition, the semiconductor layer of the TFTs constituting the pixel P may include one of amorphous silicon, polysilicon, or an oxide.

The OLED includes an anode electrode connected to a second node N2, a cathode electrode connected to a low-voltage power EVSS, and an organic compound layer disposed between the anode electrode and the cathode electrode.

The driving TFT DT controls the current Ioled flowing through the OLED according to the gate-source voltage Vgs of the driving TFT DT. The driving TFT DT includes a gate electrode connected to the first node N1, a drain electrode connected to a high-voltage power EVDD, and the source electrode connected to a second node N2.

The storage capacitor Cst is connected between the first node N1 and the second node N2.

The first switch TFT ST1 is switched in response to a first gate signal SCAN (or a first scan signal) to apply a data voltage MVdata for image display which is charged in a data line (a data voltage in which the change in the threshold voltage of the driving TFT is compensated) to the first node N1. The first switch TFT ST1 includes a gate electrode connected to a first gate line 15A (or a first scan line), a drain electrode connected to the data line, and a source electrode connected to the first node N1.

The second switch TFT ST2 is switched in response to the second gate signal SEN (or a second scan signal) to apply an initialization voltage Vref which is charged in a reference line to the second node N2. The gate electrode of the second switch TFT ST2 is connected to the second gate line (or a second scan line), the drain electrode of the second switch TFT ST2 is connected to the second node N2, and the source electrode of the switch TFT ST2 is connected to the reference line.

The data driving circuit is connected to the pixel P through the data line and the reference line. The data driving circuit may include a digital-analog converter DAC for converting the digital compensation data MDATA into a data voltage MVdata for image display, an analog-digital converter ADC operated to convert an analog sensing voltage into a digital sensing value at the time of sensing driving for an external compensation manner, a sampling switch SW2 for sampling the voltage of the source electrode of the driving TFT as the sensing voltage when a predetermined voltage is applied to the gate electrode of the driving TFT and current flows to the driving TFT, and an initialization switch SW1 for supplying an initialization voltage Vref to the reference line.

Meanwhile, the change in mobility μ of the driving TFT may be compensated according to an internal compensation scheme in an image display section. Whereas, the change in threshold voltage Vth of the driving TFT may be compensated according to an external compensation scheme in a first non-display section disposed at the front of the image display section and/or a second non-display section disposed at the rear of the image display section. Here, the first non-display section may be defined by a section immediately from when a driving power is applied to when an image is displayed, and the second non-display section may be defined by a section immediately from when the image display ends to when the driving power is cut off.

A principle in which the change in threshold voltage Vth of the driving TFT is sensed and compensated in the external compensation manner will be described with reference to FIG. 2. According to the external compensation manner, the driving TFT DT is operated in a source follower manner, and then receives, as a sensing voltage, the source voltage Vs of the driving TFT DT, and modulates input digital video data to compensate the change in threshold voltage of the driving TFT DT based on a digital sensing value SD to which the ADC converts the sensing voltage. The external compensation may be performed in at least one of the non-display sections since the time required for sensing the sensing voltage is relatively long.

A principle in which the change in mobility μ of the driving TFT is sensed and compensated in the internal compensation manner will be described with reference to FIGS. 1 and 3. The internal compensation is performed during periods including an initialization period Ti, a sensing period Ts, and a light emission period Te.

In the initialization period Ti, both of the first and second scan signals SCAN and SEN are maintained at an ON level (Lon). A gate high voltage VGH of 24 V may be selected for the ON level (Lon), but is not limited thereto. The first switch TFT ST1 is turned on in response to the first scan signal SCAN of an ON level, to apply a data voltage MVdata to the gate electrode of the driving TFT DT, and the second switch TFT ST2 is turned on in response to the second scan signal SEN of an ON level, to apply an initialization voltage Vref (or a reference voltage) to the source electrode of the driving TFT DT.

In the sensing period Ts, the first scan signal SCAN is maintained at an ON level (Lon) and the second scan signal SEN is maintained at an OFF level (Loff). A gate low voltage VGL of −6 V may be selected for the OFF level (Loff), but is not limited thereto. The first switch TFT ST1 is maintained at a turn-on state, and thus the gate voltage Vg of the driving TFT DT is maintained at the data voltage MVdata. The second TFT ST2 is turned off, and here, the current corresponding to the gate-source voltage Vgs, which is set in the initialization period Ti, flows through the driving TFT DT. Therefore, the source voltage Vs of the driving TFT DT is raised toward the data voltage MVdata applied to the gate electrode of the driving TFT DT according to a source follower manner, and the gate-source voltage Vgs of the driving TFT DT is programmed to meet the desired gray-scale level. As described above, the sensing period Ts is defined as a time during which the first scan signal SCAN is maintained at the ON level and the second scan signal SEN is maintained at the OFF level.

In the light emission period Te, both of the first and second scan signals SCAN and SEN are maintained at an OFF level (Loff). The gate voltage Vg and the source voltage Vs of the driving TFT DT are raised to a voltage level higher than the threshold voltage of the OLED and then the voltage is maintained while the gate-source voltage Vgs of the driving TFT DT programmed in the sensing period Ts is maintained. The driving current corresponding to the programmed gate-source voltage Vgs of the driving TFT DT flows through the OLED, and as a result, the OLED emits light and implements a desired grayscale.

As such, according to the internal compensation manner, the change in mobility of the driving TFT DT is compensated through a principle in which, during the sensing period Ts, the source voltage Vs of the driving TFT DT is raised in a capacitor coupling manner for a short period of time while the gate voltage Vg of the driving TFT DT is fixed to a data voltage MVdata. The driving current determining the light emitting amount (brightness) of the pixel is proportional to mobility ($\mu$) of the driving TFT DT (included in K or K' in equations) and the gate-source voltage Vgs of the driving TFT DT programmed in the sensing period Ts, as shown in mathematical formulas of FIG. 3.

During the sensing period Ts, in the pixel having large mobility (K), the source voltage Vs of the driving TFT DT is raised rapidly toward the gate voltage Vg, which is higher than the source voltage Vs and thus the gate-source voltage Vgs of the driving TFT DT is programmed to be relatively small. On the contrary, during the sensing period Ts, in the pixel having small mobility (K'), the source voltage Vs of the driving TFT DT is raised slowly toward the gate voltage Vg, which is higher than the source voltage Vs and thus the gate-source voltage Vgs of the driving TFT DT is programmed to be relatively large. As a result, the difference in brightness due to the difference in mobility ($\mu$) between pixels is compensated.

Figure 4:
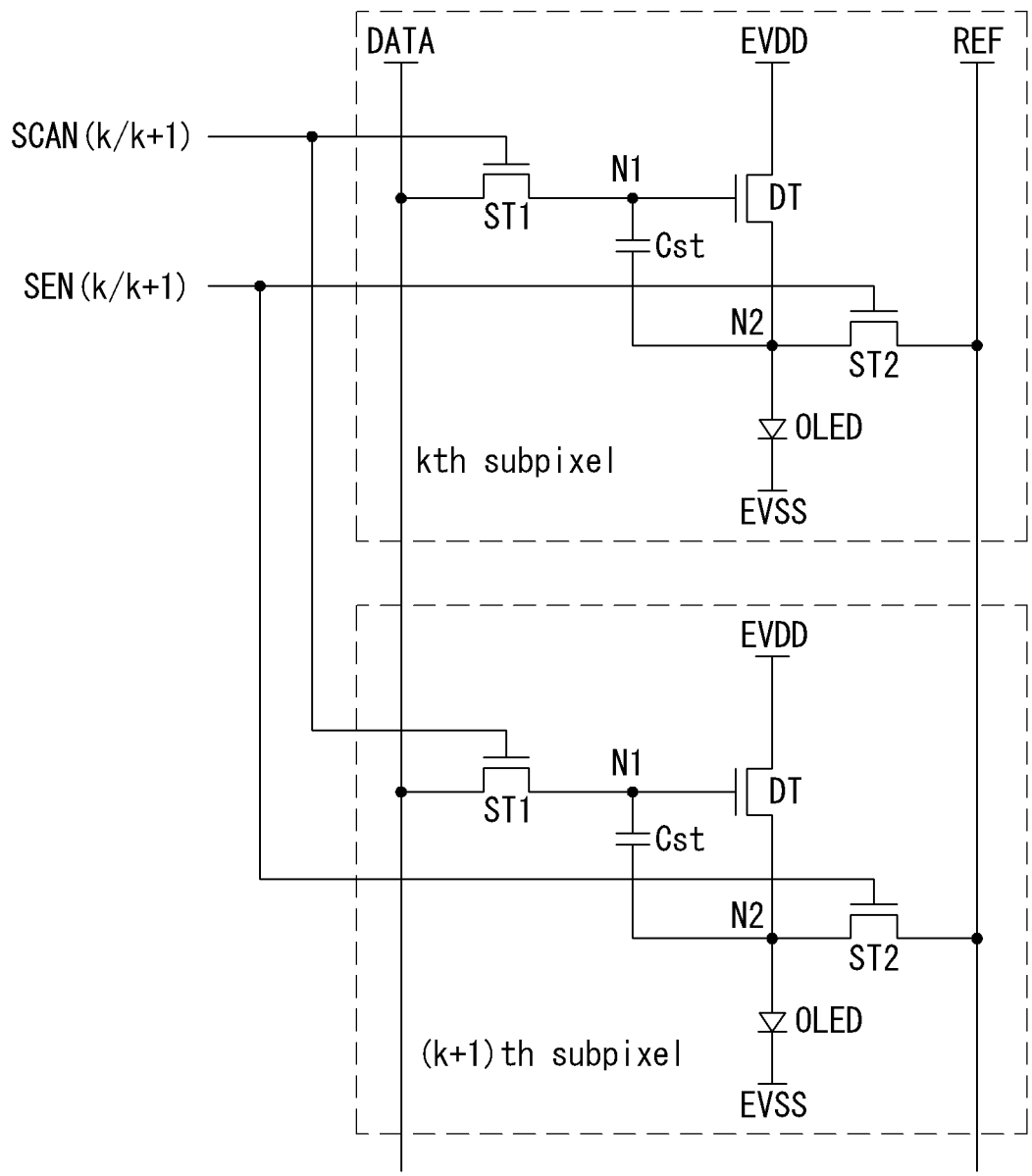
FIG. 4 shows an equivalent circuit of two sub-pixels in neighboring lines which share a first gate line for controlling the supply of the data voltage and a second gate line for controlling the supply of the reference voltage and compensate for the driving characteristic of the driving TFTs.
Figure 5:
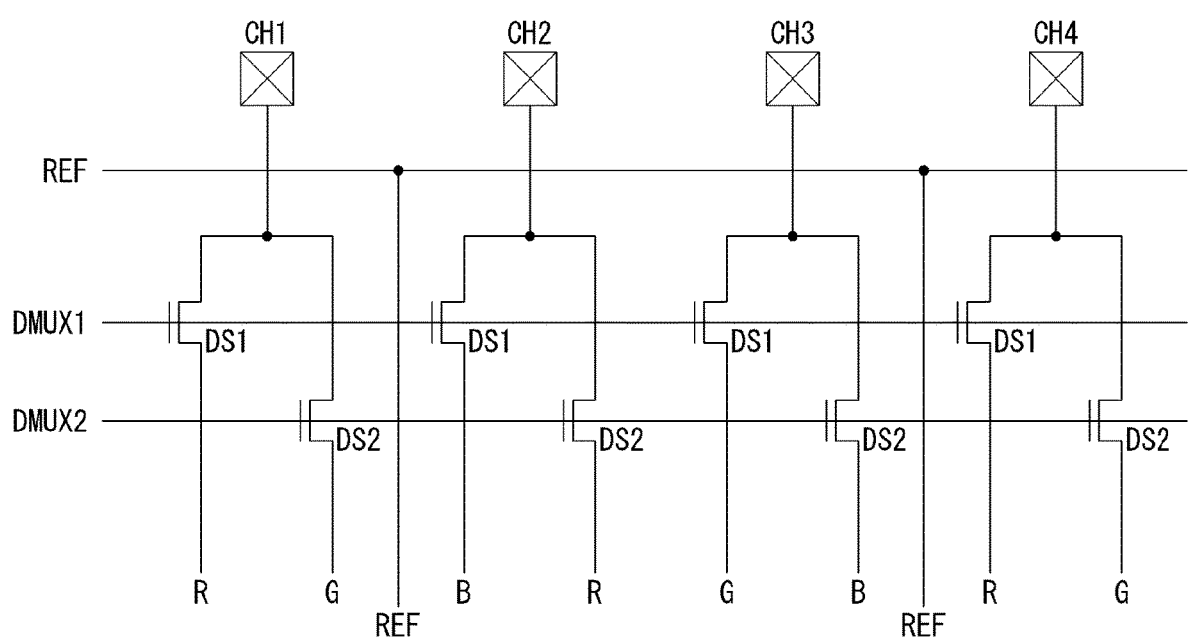
FIG. 5 illustrates a structure in which data lines of two adjacent sub-pixels of different colors share one channel.
Figure 6:
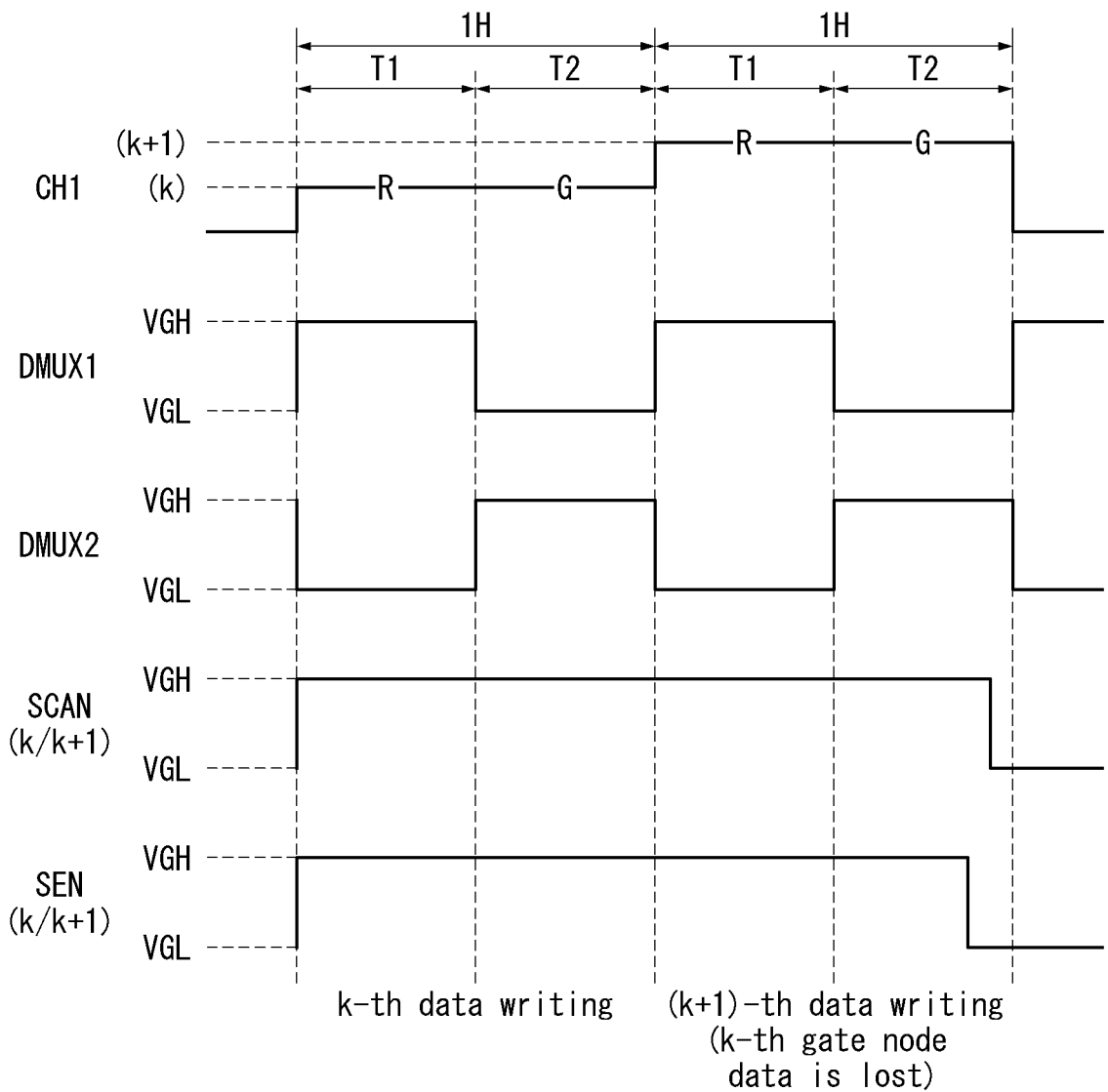
FIG. 6 shows timing charts of the driving signals for driving the circuits of FIGS. 4 and 5.

FIG. 4 shows an equivalent circuit of two sub-pixels in neighboring lines which share a first gate line for controlling the supply of the data voltage and a second gate line for controlling the supply of the reference voltage and compensate for the driving characteristic of the driving TFTs, FIG. 5 illustrates a structure in which data lines of two adjacent sub-pixels of different colors share one channel, and FIG. 6 shows the timings of the driving signals for driving the circuits of FIGS. 4 and 5.

The equivalent circuit of the sub-pixel of FIG. 4 is the same as the equivalent circuit of the sub-pixel of FIG. 1, so includes an OLED, a driving TFT DT, a storage capacitor Cst, a first switch TFT ST1 and a second switch TFT ST2. And the sub-pixels of the kth line and the (k+1) th line have the same configuration.

The sub-pixels of two lines in FIG. 4 share a first gate line for controlling the data voltage supply and a second gate line for controlling the supply of the reference voltage, so the gate electrode of the first switch TFT ST1 of the sub-pixel of the k-th line and the gate electrode of the first switch TFT ST1 of the sub-pixel of the (k+1)-th line are tied together and connected to the first gate line SCAN(k/k+1), and the gate electrode of the second switch TFT ST2 of the sub-pixel of the k-th line and the gate electrode of the second switch TFT ST2 of the sub-pixel of the (k+1)-th line are tied together and connected to the second gate line SEN(k/k+1).

The drain electrode of the first switch TFT ST1 of the sub-pixel of the k-th line and the drain electrode of the first switch TFT ST1 of the sub-pixel of the (k+1)-th line are tied together and connected to the data line DATA supplying data voltages, and the source electrode of the second switch TFT ST2 of the sub-pixel of the k-th line and the source electrode of the second switch TFT ST2 of the sub-pixel of the (k+1)-th line are tied together and connected to a reference line REF supplying a reference voltage.

In FIG. 5, data lines of two sub-pixels of different colors neighboring in a horizontal direction are supplied with data voltages through one channel. For example, two neighboring sub-pixels R and G which emit light in the same horizontal period (1H) may receive data voltages from the channel 1 CH1, and two neighboring sub-pixels B and R may receive data voltages from the channel 2 CH2. To this end, the output line of each channel is branched to form two data lines connected to different sub-pixels, and demux switches DS1 and DS2 are formed in the respective data lines, and in the demux switches DS1 and DS2 the supply of the data voltage is controlled by the demux signals DMUX1 and DMUX2.

The first demux signal DMUX1 swings to a duty ratio of 50% in one horizontal period 1H, and becomes on level in a first section T1 of each horizontal period and off level in a second section T2 of each horizontal period to connect the first demux switch DS1 on the first section T1. The second demux signal DMUX2 swings to a duty ratio of 50% in one horizontal period 1H, and becomes off level in the first section T1 of each horizontal period and one level in the second section T2 of each horizontal period to connect the second demux switch DS2 on the second section T2.

The channel 1 CH1 outputs R data voltage in the first section T1 of each horizontal period and G data voltage in the second section T2, and the R data voltage is supplied to a R sub-pixel in the first period T1 and the G data voltage is supplied to a G sub-pixel in the second period T2 according to the first and second demux signals DMUX1 and DMUX2.

Two sub-pixels of two lines corresponding to two horizontal periods 2H share the first gate line and the second gate line and each of the two sub-pixels is driven by the scan signals SCAN and SEN corresponding to two horizontal periods, so data voltages are applied to the sub-pixels of the two lines.

In FIG. 6, in a first horizontal period, a subpixel of k-th line is supplied with a data voltage for the corresponding line, the first switch TFT ST1 of the k-th sub-pixel (the sub-pixel in k-th line) is turned on by the scan signal SCAN of on level and the gate electrode of the driving TFT DT is charged to the data voltage.

In a second horizontal period, a subpixel of (k+1)-th line is supplied with a data voltage for the corresponding line, the first switch TFT ST1 of the (k+1)-th sub-pixel (the sub-pixel in (k+1)-th line) is turned on by the scan signal SCAN of on level and the gate electrode of the driving TFT DT is charged to the data voltage. However, since a data line of the channel 1 CH1 is also connected to the sub-pixel of the k-th line in the second horizontal period, when the data voltage is applied to the (k+1)-th line, the data voltage for the (k+1)-th line is applied to the k-th sub-pixel, so the sub-pixel of the k-th line loses the data voltage of the gate electrode of the driving TFT.

As described above, in the structure in which two adjacent sub-pixels emitting different colors share one channel, if a gate line for applying a data voltage is shared in units of two lines so two neighboring sub-pixels emitting the same color (a sub-pixel in k-th line and a sub-pixel in (k+1)-th line) are driven in unit of two horizontal periods, when a data voltage is supplied to the sub-pixel in the (k+1)-th line, the problem occurs that the data voltage of the gate electrode of the driving TFT of the sub-pixel of the k-th line is mixed with the data voltage of the (k+1)-th line. Therefore, in the structure in which two adjacent sub-pixels emitting different colors share one channel, the gate line cannot be shared in unit of two lines in order to apply the data voltage, and the number of gate lines cannot be reduced.

Especially, a second gate line is additionally necessary to control the application of a reference voltage for an internal compensation. As described with reference to FIGS. 4 to 6, the second gate lines cannot be shared in unit of two lines, so the first gate line and the second gate line are required for each line, which makes a pixel configuration complicated, an aperture ratio lowered, the size of GIP for generating the two scan signals larger so the free space in a bezel reduced, thus it becomes difficult to reduce the bezel in a mobile device such as a smart phone.

The present disclosure has been developed in consideration of this situation. The present disclosure proposes a structure of a mobile device employing an OLED display device in which the number of channels of a source drive IC is reduced and gate lines are shared by two line unit while the driving characteristics of pixels are subjected to external compensation and internal compensation in a hybrid manner, thereby reducing the size of a bezel.

Figure 7:
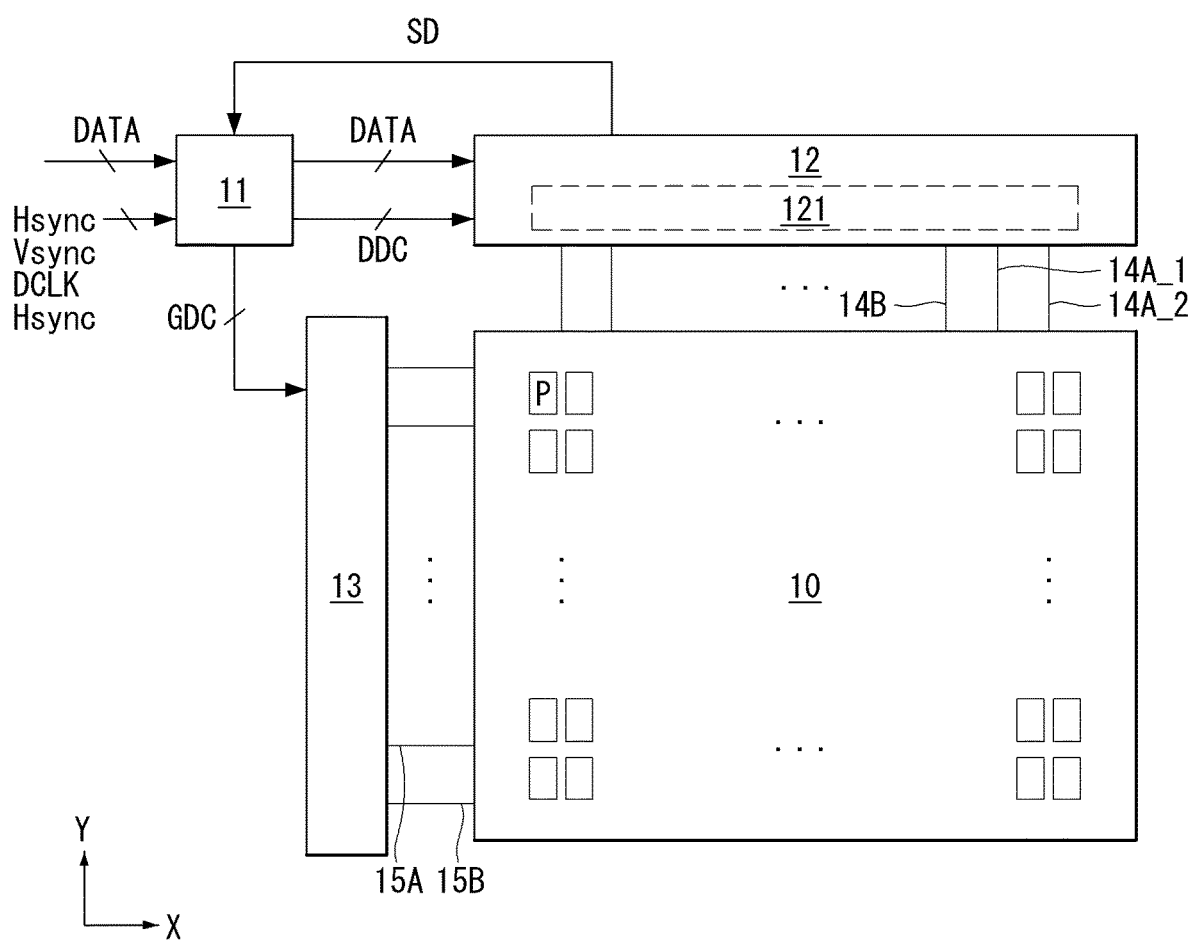
FIG. 7 is a block diagram showing a driving circuit of an organic light emitting display according to an aspect of the present disclosure.
Figure 8:
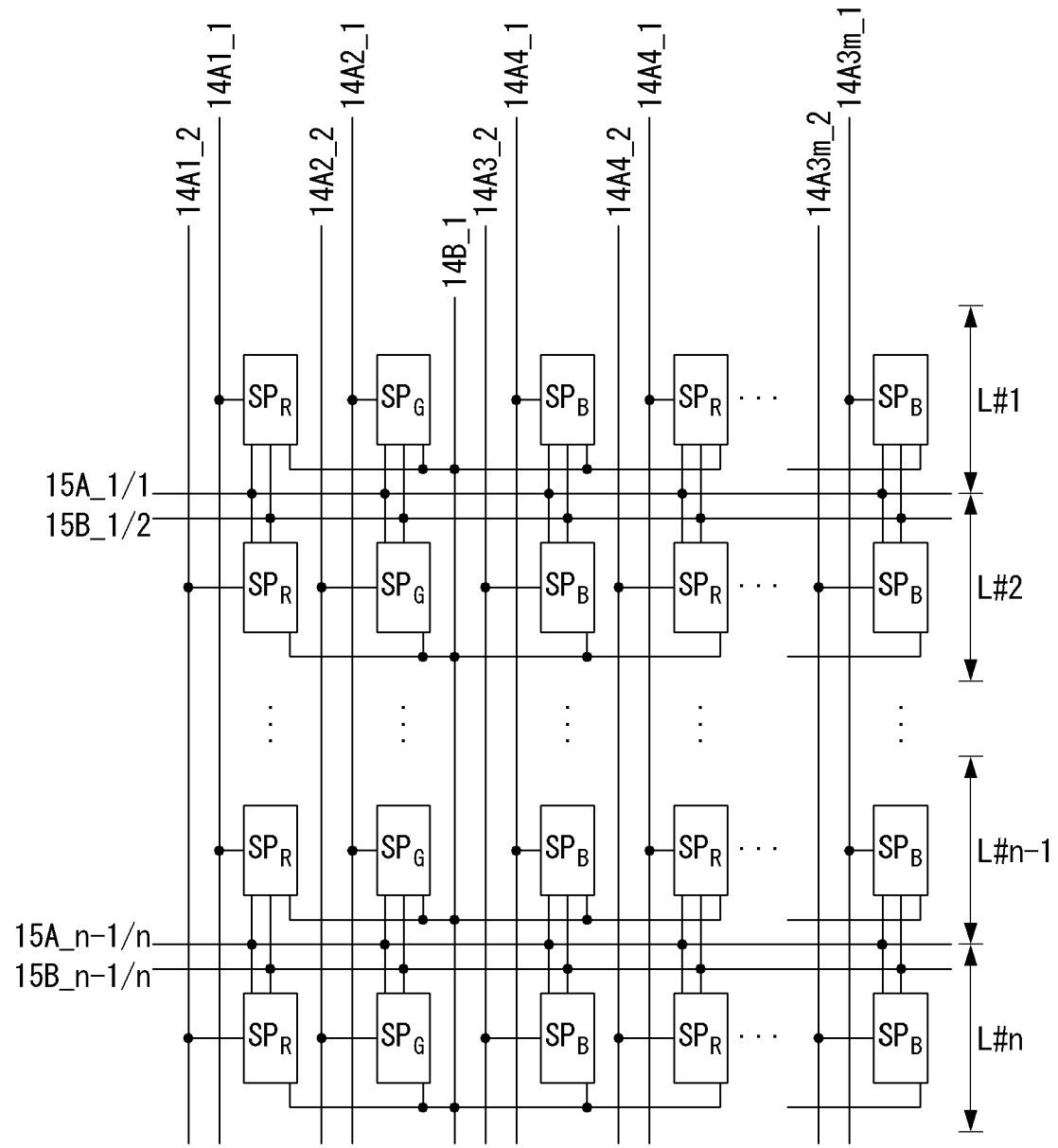
FIG. 8 shows a sub-pixel array formed on the display panel of FIG. 7.

FIG. 7 is a block diagram showing a driving circuit of an organic light emitting display according to an aspect of the present disclosure, and FIG. 8 shows a sub-pixel array formed on the display panel of FIG. 7.

The OLED display according to an aspect of the present disclosure may include a display panel 10, a timing controller 11, a data driver 12 and a gate driver 13.

A plurality of data lines 14A and reference lines 14B and a plurality of gate lines (or scan lines) 15A and 15B cross each other on the display panel 10, and the pixels for hybrid compensation (P) are arranged in a matrix form to constitute a pixel array. The plurality of the data lines 14A may include a plurality of first data lines 14A_1 and a plurality of second data lines 14A_2. The plurality of gate lines 15 may include a plurality of first gate lines 15A to which a first scan signal SCAN is supplied and a plurality of second gate lines 15B to which a second scan signal SEN may be supplied.

A pixel P may include an OLED, a driving TFT, a storage capacitor, a first switch TFT, and a second switch TFT. The TFTs constituting the pixel P may be implemented as a p-type or an n-type or as a hybrid type in which P-type and N-type are mixed. In addition, the semiconductor layer of the TFTs may include one of amorphous silicon, polysilicon, or an oxide.

Each of the pixels P is connected to any one of the data lines 14A_1 or 14A_2, any one of the reference lines 14B, any one of the first gate lines 15A, or any one of the second gate lines 15B.

For example, each pixel P disposed in a first pixel line L#1 is connected to one of the first data lines 14A_1 and each pixel P disposed in a second pixel line L#2 is connected to one of the second data lines 14A_2, such that each pixel P disposed in an odd-numbered pixel line L#(2i-1) may be connected to one of the first data lines 14A_1 and each pixel P disposed in an even-numbered pixel line L#(2i) may be connected to one of the second data lines 14A_2. Odd and even numbers can be changed.

A plurality of pixels P included in one pixel unit may share one reference line 14B. The pixel unit may be composed of three sub-pixels including a red subpixel, a green subpixel, and a blue subpixel (FIG. 8 shows an example in which 1 pixel unit is composed of three sub-pixels, so the data line connected to the last positioned sub-pixel is 14A3m_1 or 14A3m_2), but it is not limited thereto. It may be composed of four sub-pixels further including a white sub-pixel, or in some cases by two sub-pixels. In addition, although not shown, the sub-pixels included in one pixel unit may be independently connected to one of a plurality of reference lines without sharing one reference line. Each of the pixels P is supplied with a high potential drive voltage and a low potential drive voltage from a power supply not shown.

All pixels P arranged in a first pixel line L#1 and all pixels P arranged in a second pixel line L#2 may share one 15A_1/2 of the first gate lines 15A and one 15B_1/2 of the second gate lines 15B. That is, all pixels P arranged in an odd-numbered pixel line L#(2k-1) and all pixels P in an adjacent even-numbered pixel line L#(2k) may share one 15A_(2k-1)/2k of the first gate lines 15A and one 15B_(2k-1)/2k of the second gate lines 15B with each other.

The organic light emitting display device of the present disclosure employs an external compensation technique and an internal compensation technique in order to compensate driving characteristics of pixels. The external compensation scheme is a technique of sensing electrical characteristics (threshold voltage) of driving TFTs or the change of the electrical characteristics and compensating for the digital data of input image according to the sensed values. The internal compensation scheme is a technique for compensating for the electron mobility or the change of the mobility.

The timing controller 11 may temporally separate the sensing driving (or external compensation driving) for sensing driving characteristics of the pixels and updating compensation values according to sensed characteristics and the display driving for displaying the input image reflecting the compensation values according to a predetermined control sequence. By the control operation of the timing controller 11, the external compensation driving is performed during vertical blank periods (or vertical blank periods) while the display driving is performed, or during a power-on sequence period before the display driving is started (a non-display period until a image display period in which an image is displayed after driving power is applied), or in a power-off sequence period after the display driving is finished (a non-display period until the drive power is turned off immediately after the image display is ended).

The vertical blank period is a period in which input image data is not written, and is arranged between two vertical active periods in each of which input image data for one frame is written. The power-on sequence period refers to a transient period from when the driving power is turned on until the input image is displayed. The power-off sequence period means a transient period from the end of the display of the input image until the driving power is turned off.

The external compensation driving for sensing and compensating the driving TFT characteristics may be performed in a state where only the screen of the display device is turned off during the system power supply, for example, in a standby mode, a sleep mode, a low power mode, and the like. The timing controller 11 detects a standby mode, a sleep mode, a low power mode, and the like according to a predetermined sensing process, and controls all operations for the external compensation driving.

The pixel P may further include an internal compensation circuit. The internal compensation circuit includes one or more switch TFTs and one or more capacitors to initialize the gate of the driving TFT and then senses the threshold voltage and mobility of the driving TFT to compensate the data voltage.

The timing controller 11 generates the data control signal DDC for controlling the operation timings of the data driver 12 and the gate control signal GDC for controlling the operation timings of the gate driver 13, based on timing signals, such as a vertical synchronization signal Vsync, a horizontal synchronization signal Hsync, a dot clock signal DCLK, and a data enable signal DE. In addition, the timing controller 11 may temporally separate the period during which the image display is performed and the period during which the external compensation operation is performed, and generate control signals (DDC, GDC) for image display and control signals (DDC, GDC) for external compensation differently. The internal compensation operation is performed during a period for displaying an image, and may performed with different turn-off points (a second scan signal SEN is turned off before a first scan signal SCAN is turned off) after the first scan signal SCAN and the second scan signal SEN are turned on together.

The gate control signal GDC includes a gate start pulse GSP, a gate shift clock GSC, a gate output enable signal GOE, and the like. The gate start pulse (GSP) is applied to a gate stage that generates a first scan signal to control the gate stage to generate the first scan signal. The gate shift clock GSC is a clock signal commonly input to the gate stages, and is a clock signal for shifting the gate start pulse GSP. The gate output enable signal GOE is a masking signal that controls the output of the gate stages.

The data control signal DDC includes a source start pulse SSP, a source sampling clock SSC, a source output enable signal SOE, and the like. The source start pulse SSP controls the data sampling start timing of the data driver 12. The source sampling clock SSC is a clock signal that controls the sampling timings of data in respective source drive ICs on the basis of a rising or falling edge. The source output enable signal SOE controls the output timing of the data driver 12.

The data control signal DDC controls the operation timings of the initialization switch SW1 for supplying a reference voltage Vref to the reference line 14B and the sampling switch SW2 for sampling a voltage sensing value according to the external compensation operation.

The timing controller 11 receives a digital sensing value SD according to the external compensation operation from the ADC of the data driver 12. The timing controller 11 may modify input digital video data RGB based on the digital sensing value SD to compensate for the electrical characteristic deviation of the driving TFTs among pixels or to compensate for the deterioration deviation of the OLEDs among the pixels. The timing controller 11 transmits the compensated digital video data MDATA to the data driver 12 during an operation period for image display.

The data driver 12 may include at least one source drive IC SDIC and a demux switch unit 121.

The source drive IC SDIC includes a plurality of digital-to-analog converters (hereinafter referred to as a DAC) connected to the data lines 14A and a plurality of sensing units and a plurality of ADCs connected to a plurality of reference lines 14B. Each sensing unit is individually connected to each pixel P disposed in one pixel line (for example, Li) via the reference line 14B or connected in common to a plurality of pixels P arranged in one pixel line (for example, Li) via the reference line 14B. In FIG. 8, one unit pixel composed of four pixels P is shown as sharing one reference line 14B, but the technical idea of the present disclosure is not limited thereto. The technical idea of the present disclosure can be applied to various modifications in which two or more pixels P are connected to one sensing unit via one reference line 14B.

The DAC of the source drive IC converts input image data into data voltages for displaying in accordance with the data control signal DDC applied from the timing controller 11 at the time of display driving and supplies the data voltages to the data lines 14A. The data voltage for display is a voltage that varies depending on the gray level of the input image.

The DAC of the source drive IC generates data voltages for sensing in accordance with the data control signal DDC applied from the timing controller 11 at the time of the sensing driving for the external compensation and supplies the data voltages to the data lines 14A. The data voltages for sensing are capable of turning on the driving TFTs provided in the pixels P during the sensing driving. The data voltages for sensing may be generated with the same value for all the pixels P. Also, taking into account that the pixel characteristics are different for each color, the data voltages for sensing may be generated with different values for individual colors. For example, the data voltage for sensing may be generated with a first value for first pixels representing a first color, a second value for second pixels representing a second color and a third value for third pixels representing a third color.

The sensing unit supplies a reference voltage Vref to the reference line 14B based on the data control signal DDC or senses and holds a sensing value (electrical characteristic value for the OLED or the driving TFT) inputted through the reference line 14B and then feeds it to the ADC. The sensing unit may be implemented as a current sensing type or a voltage sensing type.

The demux switch unit 121 may include first, second, third and fourth switches with respect to each channel of the source drive IC. The first and second switches distribute the signals (data voltages) output from a corresponding channel to two data lines respectively connected to two neighboring (neighboring in a horizontal direction in which the gate line advances) sub-pixels emitting different colors and the third and fourth switches distribute the signals to two data lines respectively connected to two neighboring (neighboring in a vertical direction in which the data line or the reference line advances) sub-pixels emitting the same color.

The first and second switches are controlled in opposite phases with a period of one horizontal period, and the third and fourth switches are controlled in opposite phases in a period of two horizontal periods, so that the data voltages can be provided to the sub-pixels adjacent in the horizontal direction and the vertical direction through one channel.

The gate driver 13, during display driving, generates first scan signals SCAN synchronized with the data voltages based on the gate control signal GDC and sequentially supplies the first scan signals SCAN to first gate lines 15A respectively connected to pixel lines Li, Li+1, Li+2, Li+3, . . . , to select a pixel line to which the data voltages are to be written. The pixel lines Li, Li+1, Li+2, Li+3, . . . mean a set of horizontally neighboring pixels P. The gate pulse swings between a gate high voltage VGH and a gate low voltage VGL. The gate high voltage VGH is set to a voltage higher than a threshold voltage of a TFT to turn the TFT on, and the gate low voltage VGL is lower than the threshold voltage of the TFT.

For the internal compensation during the display driving, the gate driver 13 generates second scan signals SEN based on the gate control signal GDC and sequentially supplies the second scan signals SEN to second gate lines 15B respectively connected to the pixel lines Li, Li+1, Li+2, Li+3, . . . , to select a pixel line to which a reference voltage is to be written.

Since the first gate line 15A and the second gate line 15B are shared by the pixels of two neighboring pixel lines, the first scan signal SCAN and the second scan signal SEN have the pulse width corresponding to 2 horizontal period 2H.

During the sensing driving for external compensation, the gate driver 13 generates the scan signals for sensing based on the gate control signal GDC and sequentially supplies the scan signals to the first gate lines 15A respectively connected to the pixel lines Li, Li+1, Li+2, Li+3, . . . . The scan signal for sensing may have an on-pulse interval wider than a scan signal for display. One or more on-pulse sections of the scan signal for sensing may be included within one line sensing on-time. Here, the one line sensing on-time means a scan time taken to simultaneously sense the pixels P of one pixel line.

Figure 9:
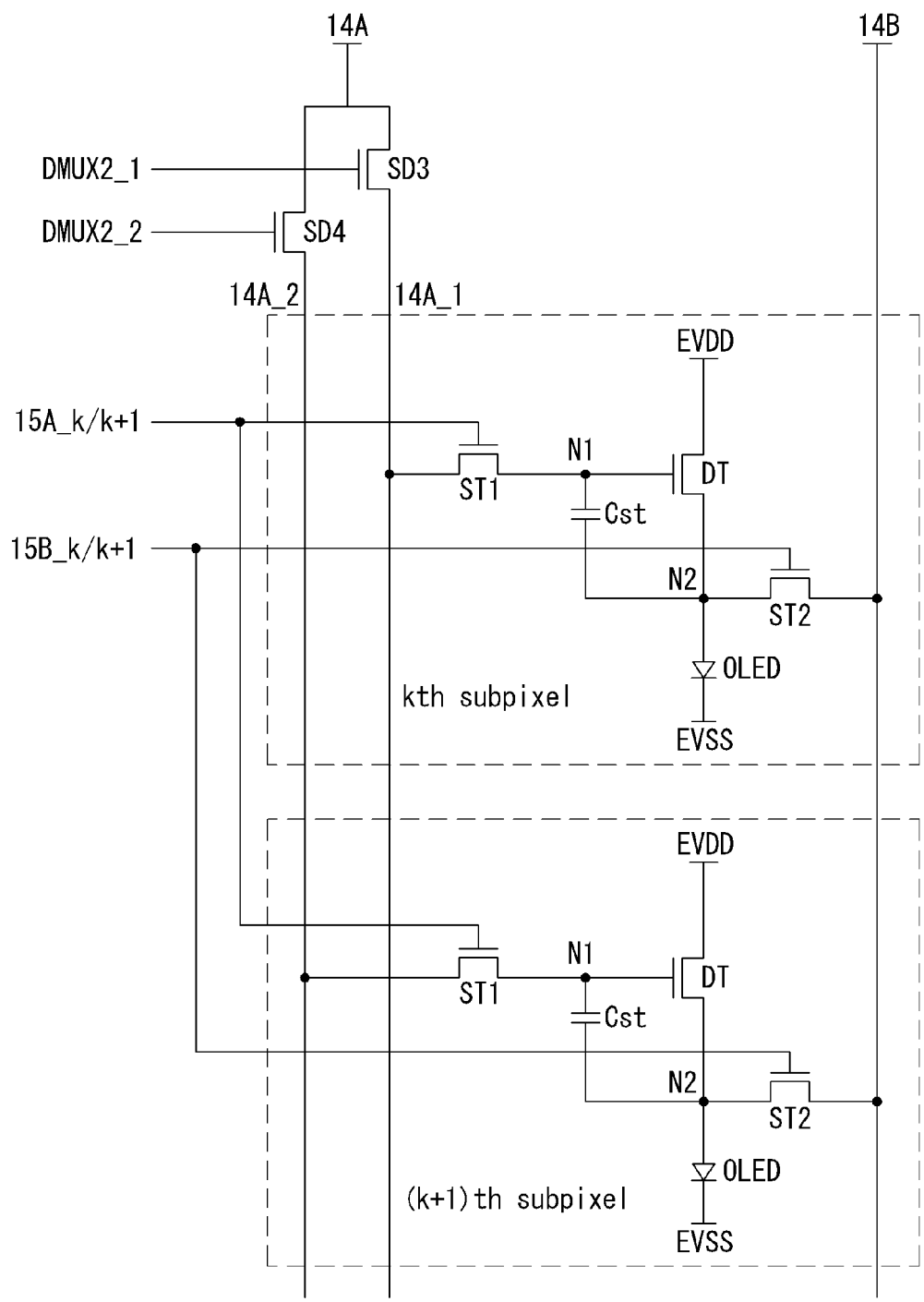
FIG. 9 shows an equivalent circuit of two sub-pixels in neighboring lines which share a first gate line for controlling data supply and a second gate line for controlling reference voltage supply and receive data voltages through separate data lines, according to an aspect of the present disclosure.
Figure 10:
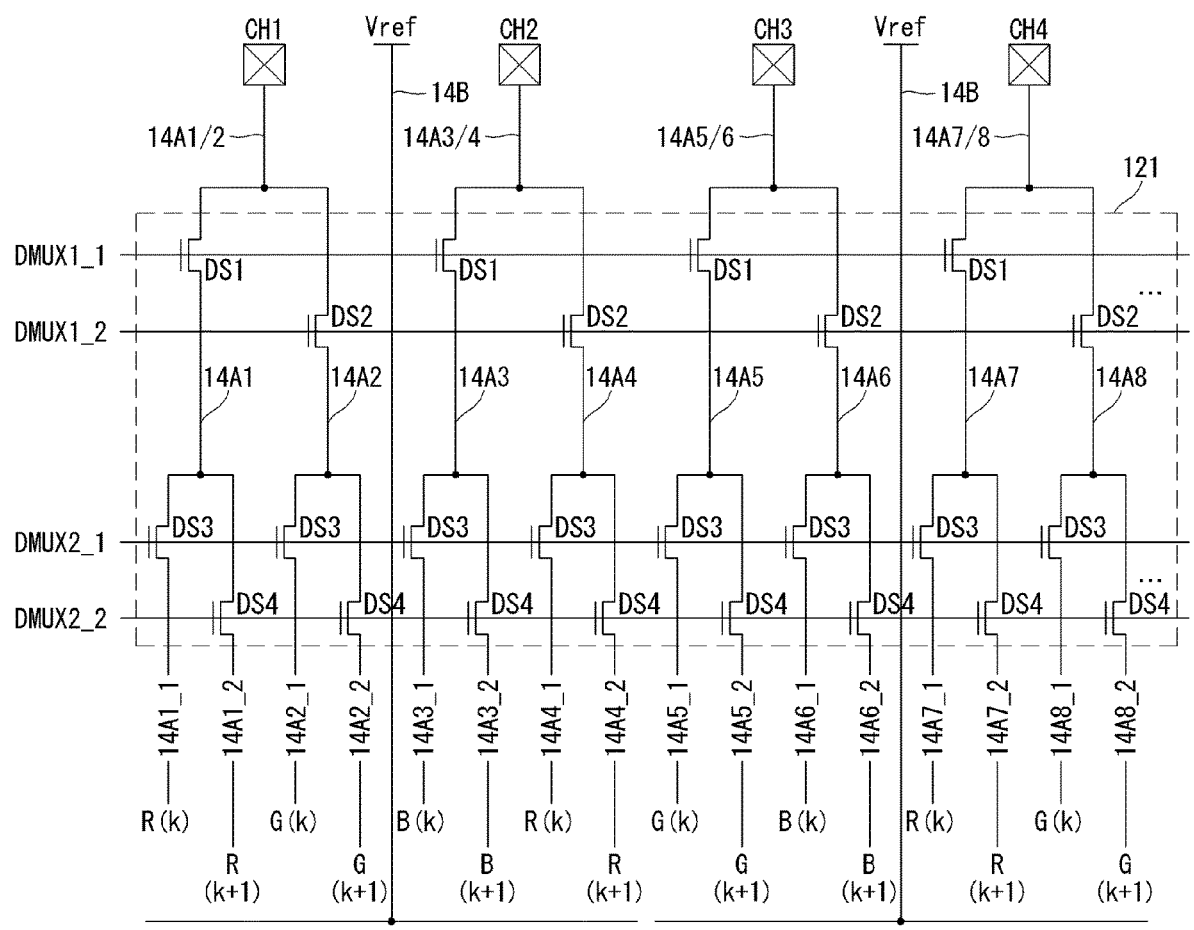
FIG. 10 shows a data line structure in which data lines of two neighboring sub-pixels of different colors share one channel and data voltages are supplied to two sub-pixels of neighboring lines through separate data lines, data voltages and the circuit for driving the data lines, according to an aspect of the present disclosure.
Figure 11:
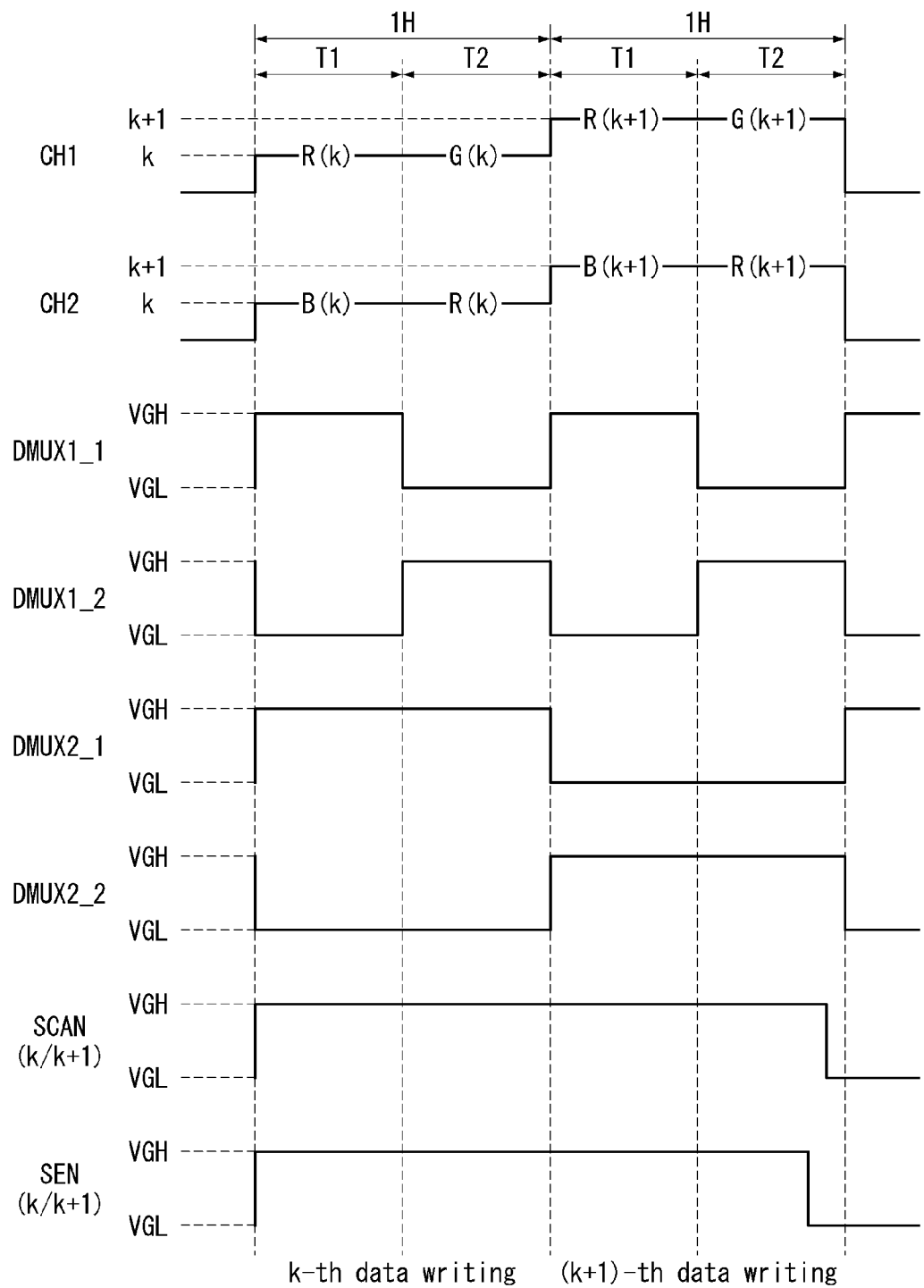
FIG. 11 shows timing charts of the driving signals for driving the circuits of FIGS. 9 and 10 according to an aspect of the present disclosure.

FIG. 9 shows an equivalent circuit of two sub-pixels in neighboring lines which share a first gate line for controlling data supply and a second gate line for controlling reference voltage supply and receive data voltages through separate data lines, according to an aspect of the present disclosure, FIG. 10 shows the data line structure in which data lines of two neighboring sub-pixels of different colors share one channel and data voltages are supplied to two sub-pixels of neighboring lines through separate data lines, data voltages and the circuit for driving the data lines, according to an aspect of the present disclosure, and FIG. 11 shows the timings of the driving signals for driving the circuits of FIGS. 9 and 10 according to an aspect of the present disclosure.

In FIG. 9, each sub-pixel includes an OLED, a driving TFT DT, a storage capacitor Cst, a first switch TFT ST1, and a second switch TFT ST2. The sub-pixels of the k-th line and the (k+1)-th line which are adjacent to each other in a direction in which data lines advance (vertical direction) emit the same color, share the same channel but are supplied with data voltages in different horizontal periods through different data lines 14A_1 and 14A_2, are supplied with the reference voltage through the same reference line 14B, supply the sensing voltage of the source electrode N2 of the driving TFT DT to the data driver 12, and share the same first gate line and second gate lines 15A_k/k+1 and 15B_k/k+1.

In FIG. 9, a data line 14A providing data voltages of a same color is branched into two data lines 14A_1 and 14A_2 to be connected to a sub-pixel of the k-th line and a sub-pixel of the (k+1)-th line. And the connection of the two branched data lines and the two sub-pixels are respectively controlled through the third and fourth demux switches DS3 and DS4.

The third and fourth demux switches DS3 and DS4 are controlled by the third and fourth control signals DMUX2_1 and DMUX2_2 to operate at intervals of two horizontal periods. The third and fourth control signals DMUX2_1 and DMUX2_2 maintain off-level during one horizontal period and operate in opposite phases with each other.

In FIG. 10, each of the channels CH1, CH2, etc. supplies data voltages to two neighboring sub-pixels emitting different colors, and supplies data voltages to two neighboring sub-pixels emitting the same color through different data lines branched.

The channel 1 CH1 branches to two data lines 14A1 and 14A2 to supply data voltages to the red sub-pixel R and the green sub-pixel G. The supply of the data voltages to the data lines 14A1 and 14A2 is controlled by the first and second control signals DMUX1_1 and DMUX1_2 via the first and second demux switches DS1 and DS2, respectively. The data line 14A1 for the red sub-pixel R again branches to two data lines 14A1_1 and 14A1_2 to be connected to two sub-pixels R(k) and R(k+1) of neighboring lines. The supply of the data voltages to the data lines 14A1_1 and 14A1_2 is controlled by the third and fourth control signals DMUX2_1 and DMUX2_2 via the third and fourth demux switches DS3 and DS4, respectively. Likewise, the data line 14A2 for the green sub-pixel G again branches to two data lines 14A2_1 and 14A2_2 to be connected to two sub-pixels G(k) and G(k+1) of neighboring lines. The supply of the data voltages to the data lines 14A2_1 and 14A2_2 is controlled by the third and fourth control signals DMUX2_1 and DMUX2_2 via the third and fourth demux switches DS3 and DS4, respectively.

As shown in FIG. 10, with respect to one channel, six demuxes (including first and second demux switches DS1 and DS2 and two sets of third and fourth demux switches DS3 and DS4) are used to select one of two sub-pixels of different colors to be supplied with a data voltage and to select one of two sub-pixels of different lines to be supplied with a data voltage. The first and second demux switches DS1 and DS2 and two sets of third and fourth demux switches DS3 and DS4 constitute a demux switching unit 121 and are disposed in the data driver 12.

In FIG. 10, four sub-pixels R(k), G(k), B(k) and R(k) of the same line are connected to the same reference line 14B to be supplied with a reference voltage Vref, which is just for an example. Two or three sub-pixels of the same line may be connected to the same reference line 14B.

The operations of the sub-pixels of two neighboring lines k/(k+1) during two horizontal periods 2H will be described with reference to FIG. 11.

The channel 1 CH1 sequentially outputs data voltages R and G for red and green sub-pixels in each horizontal period 1H, and outputs the R data voltage in a first period T1 and outputs the G data voltage in a second period T2. The channel 2 CH2 sequentially outputs data voltages B and R for blue and red sub-pixels in each horizontal period 1H, and outputs the B data voltage in the first period T1 and outputs the R data voltage in the second period T2.

The channel 1 CH1 outputs data voltages R(k) and G(k) for k-th sub-pixels in a first horizontal period, and outputs data voltages R(k+1) and G(k+1) for (k+1)-th sub-pixels in a second horizontal period The first control signal DMUX1_1 becomes on level in a first period T1 of each horizontal period 1H and becomes off level in a second period T2, and the second control signal DMUX1_2 becomes off level in the first period T1 of each horizontal period 1H and becomes on level in the second period T2, which allows each channel to select a sub-pixel to which a data voltage is to be applied among two neighboring sub-pixels emitting different colors.

The third control signal DMUX2_1 becomes on level in a first horizontal period of two horizontal periods 2H and becomes off level in a second horizontal period of the two horizontal period 2H, and the fourth control signal DMUX2_2 becomes off level in the first horizontal period of the two horizontal period 2H and becomes on level in the second horizontal period of the two horizontal period 2H, which allows the sub-pixels of k-th line to be supplied with data voltages in the first horizontal period and allows the sub-pixels of (k+1) line to be supplied with data voltages in the second horizontal period.

The first gate line 15A is commonly connected to sub-pixels of k-th line and sub-pixels of (k+1)-th line, and the second gate line 15B is commonly connected to the sub-pixels of the k-th line and the sub-pixels of the (k+1)-th line. The first and second gate lines 15A and 15B are supplied with first and second scan signals SCAN(k/k+1) and SEN(k/k+1) having a pulse width corresponding to two horizontal periods 2H.

The first scan signal SCAN(k/k+1) becomes on level in synchronization with the start of a first horizontal period and maintains the on level during the first horizontal period, so sub-pixels of k-th line are supplied with data voltages (R(k) and G(k) for channel 1). The first scan signal SCAN(k/k+1) maintains the on level until just before the completion of a second horizontal period, so sub-pixels of (k+1)-th line are supplied with data voltages R(k+1) and G(k+1), then the first scan signal SCAN(k/k+1) changes to off level.

The second scan signal SEN(k/k+1) becomes the on level in synchronization with the start of the first horizontal period and maintains the on level during the first horizontal period, so sub-pixels of k-th line are supplied with a reference voltage. The second scan signal SEN(k/k+1) maintains the on level in the front part of the second horizontal period, and after sub-pixels of (k+1)-th line are supplied with the reference voltage, the second scan signal SEN(k/k+1) first changes to the off level before the first scan signal SCAN(k/k+1) changes to the off level.

The period in which both the first scan signal SCAN(k/k+1) and the second scan signal SEN(k/k+1) maintain the on level corresponds to the initialization period T1 in FIG. 3, during which the data voltage MVdata is applied to the gate electrode N1 of the driving TFT DT and the reference voltage Vref is applied to the source electrode N2 of the driving TFT DT.

The period in which the first scan signal SCAN(k/k+1) is the on level and the second scan signal SEN(k/k+1) is off level corresponds to the sensing section Ts in FIG. 3, during which the current corresponding to the gate-source voltage Vgs, which is set in the initialization period Ti, flows, the source voltage Vs of the driving TFT DT is raised toward the data voltage MVdata applied to the gate electrode of the driving TFT DT and the gate-source voltage Vgs of the driving TFT DT is programmed to meet the desired grayscale level, so the mobility of the driving TFTs DT included in the k-th sub-pixel and the (k+1)-th sub-pixel is compensated for.

The period in which the first scan signal SCAN(k/k+1) and the second scan signal SEN(k/k+1) are both the off level corresponds to the light emission period Te in FIG. 3, during which the gate voltage Vg and the source voltage Vs of the driving TFT DT are raised to a voltage level higher than the threshold voltage of the OLED and then maintain the voltage while the gate-source voltage Vgs of the driving TFT DT programmed in the sensing period Ts is maintained, so the driving current corresponding to the programmed gate-source voltage Vgs of the driving TFT DT flows through the OLED, and as a result, the OLED emits light and implements a desired grayscale.

FIGS. 12A to 12D show driving signals for driving the circuits of FIGS. 9 and 10, and signals of the gate electrode and the source electrode of the driving TFT.

Figure 12A:
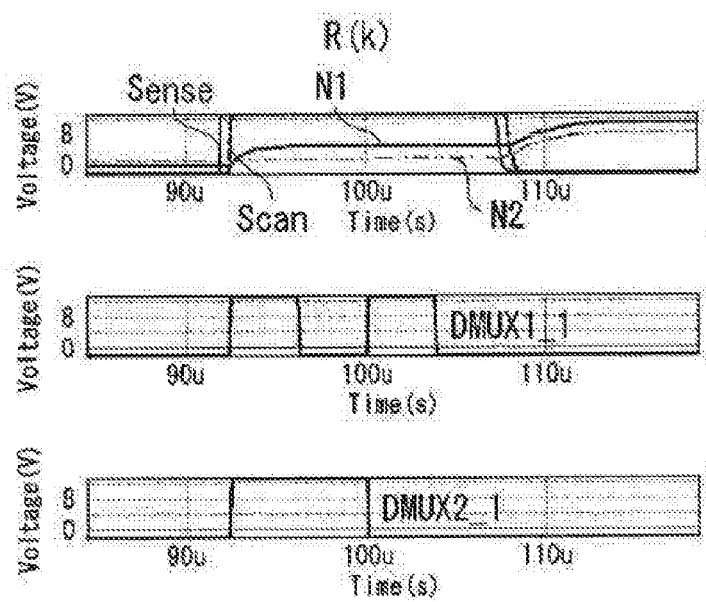
FIGS. 12A to 12D show driving signals for driving the circuits of FIGS. 9 and 10, and signals of the gate electrode and the source electrode of the driving TFT.

The red sub-pixel of the k-th line R(k) in FIG. 12A is supplied with a data voltage and a reference voltage, at the beginning of the first period T1 of the first horizontal period, according to the first scan signal SCAN(k/k+1) and the second scan signal SEN(k/k+1) both of which are on level, so is initialized. The red sub-pixel of the k-th line R(k) maintains the initialization period until the second scan signal SEN(k/k+1) becomes off level at the rear part of the second period T2 of the second horizontal period. When the first scan signal SCAN(k/k+1) is the on level and the second scan signal SEN(k/k+1) is the off level at the rear part of the second period T2 of the second horizontal period, the mobility of the driving TFT DT is compensated for. When the first scan signal SCAN(k/k+1) and the second scan signal SEN(k/k+1) are both the off level at the end part of the second period T2 of the second horizontal period, the OLED emits light with a driving current whose threshold voltage is compensated.

Figure 12B:
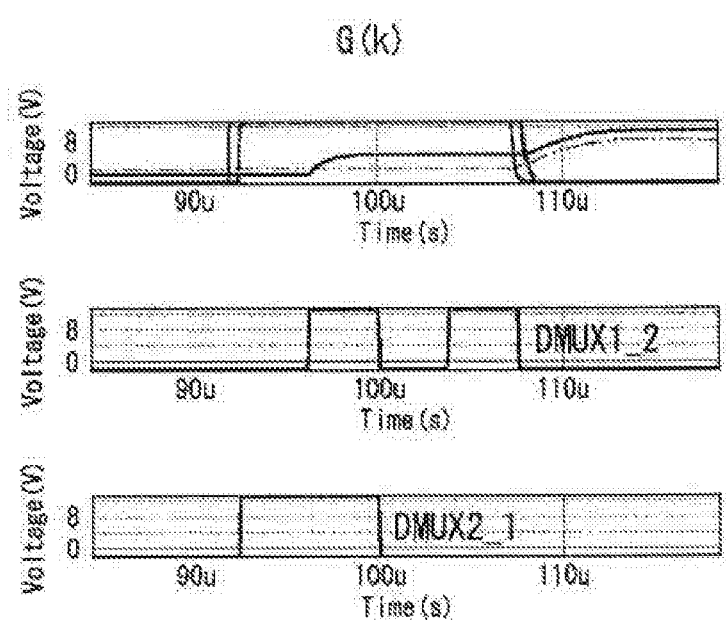

The green sub-pixel of the k-th line G(k) in FIG. 12B is supplied with a data voltage and the reference voltage, at the beginning of the second period T2 of the first horizontal period, according to the first scan signal SCAN(k/k+1) and the second scan signal SEN(k/k+1) both of which are the on level, so is initialized. The operations in the sensing period and the light emission period are the same as those for the red sub-pixel of the k-th line.

Figure 12C:
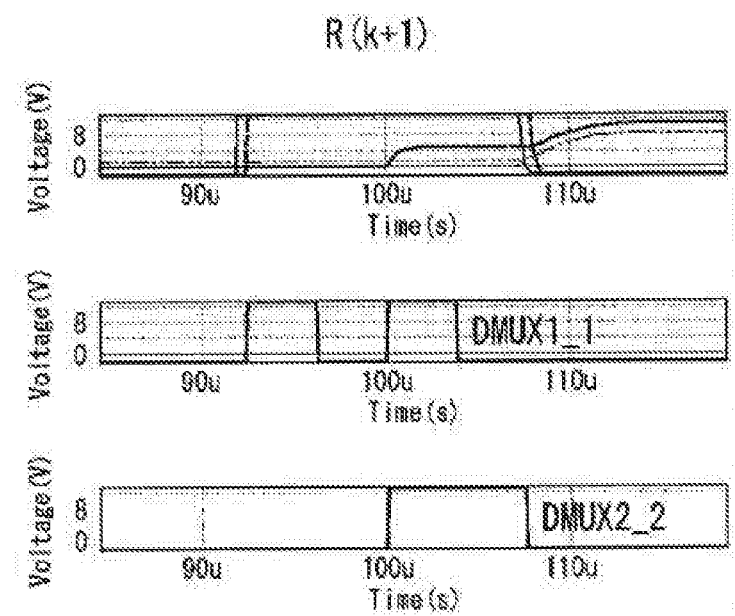

The red sub-pixel of the (k+1)-th line R(k+1) in FIG. 12C is supplied with a data voltage and the reference voltage, at the beginning of the first period T1 of the second horizontal period, according to the first scan signal SCAN(k/k+1) and the second scan signal SEN(k/k+1) both of which are on level, so is initialized. The operations in the sensing period and the light emission period are the same as those for the red sub-pixel of the k-th line.

Figure 12D:
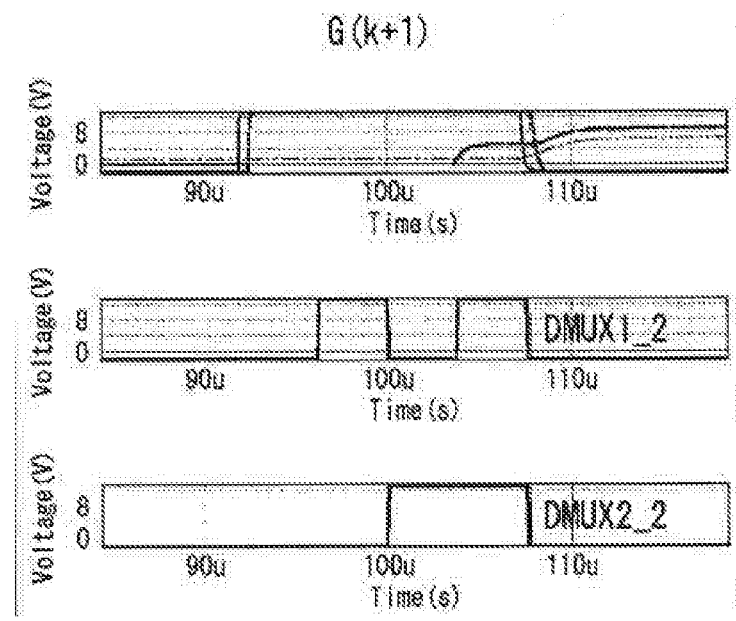

The green sub-pixel of the (k+1)-th line G(k+1) in FIG. 12D is supplied with a data voltage and the reference voltage, at the beginning of the second period T2 of the second horizontal period, according to the first scan signal SCAN(k/K+1) and the second scan signal SEN(k/k+1) both of which are the on level, so is initialized. The operations in the sensing period and the light emission period are the same as those for the red sub-pixel of the k-th line.

As described above, the hybrid compensation that performs external compensation and internal compensation is realized while the sub-pixels of two neighboring lines share the first gate line for controlling the supply of the data voltage and the second gate line for controlling the supply of the reference voltage, so the number of gate lines can be reduced and the bezel can be reduced.

Furthermore, two adjacent sub-pixels emitting different colors share one channel, thereby reducing the number of output channels included in the source drive IC, thereby reducing the bezel size.

Meanwhile, the present disclosure can be applied to a case where each channel applies data voltages to only one sub-pixel instead of applying data voltages to two neighboring sub-pixels emitting light of different colors, in which case the first and second demux switches DS1 and DS2 may be omitted. However, even in this case, by implementing the hybrid compensation while the sub-pixels of two neighboring lines emitting a same color are supplied with data voltages through the different data lines and sharing same first and second gate lines, the number of gate lines can be reduced to ⅔, and the bezel size can be reduced when the gate driver is implemented by a GIP circuit.

It will be apparent to those skilled in the art that various modifications and variations can be made in the present disclosure without departing from the spirit or scope of the disclosure. Therefore, the technical scope of the present disclosure should not be limited to the contents described in the detailed description of the specification, but should be defined by the claims.

What is claimed is:
1. An organic light emitting display device, comprising:
a display panel including a plurality of sub-pixels each of which includes an organic light emitting diode (OLED), a driving TFT controlling a driving current flowing through the OLED, a first switch TFT applying a data voltage to a gate electrode of the driving TFT, a second switch TFT applying a reference voltage to a source electrode of the driving TFT, and a storage capacitor connected between the gate electrode and the source electrode of the driving TFT;
a data driving unit configured to output the data voltage to a data line connected to the sub-pixels, and output the reference voltage to a reference line connected to the sub-pixels; and a gate driving unit configured to output signals to a first gate line connected to the gate electrode of the first switch TFT and a second gate line connected to the gate electrode of the second switch TFT, wherein two adjacent sub-pixels emitting a same color and neighboring in a direction in which the data line advances are supplied with the data voltage through different data lines and share the first gate line and the second gate line.

2. The organic light emitting display device of claim 1, wherein the two adjacent sub-pixels emitting different colors are supplied with the data voltage though a same channel.

3. The organic light emitting display device of claim 2, wherein the data driving unit comprises a demux switching unit including first, second, third and fourth demux switches, wherein the first and second demux switches select one of the two adjacent sub-pixels emitting different colors and the third and fourth demux switches select one of the two adjacent sub-pixels emitting the same color when the data driving unit applies the data voltages output from the channel to the data lines.

4. The organic light emitting display device of claim 3, wherein the first and second demux switches are controlled by signals having a duty ratio of 50% and a period of one horizontal period and in opposite phases to each other, and the third and fourth demux switches are controlled by signals having a duty ratio of 50% and a period of two horizontal periods and in opposite phases to each other.

5. The organic light emitting display device of claim 1, wherein a first scan signal applied to the first gate line maintains on-level and a second scan signal applied to the second gate line maintains off-level during a sensing period, during which a source voltage of the driving TFT rises toward a data voltage applied to the gate electrode of the driving TFT, and the first and second scan signals maintain off-level during an emission period, during which the OLED emits light according to a driving current programmed in the sensing period in order to compensate for a change of mobility of the driving TFT.

6. The organic light emitting display device of claim 5, wherein the first and second scan signals become the on-level in synchronization with a start of a first horizontal period, the first scan signal becomes the off-level before a second horizontal period ends, and the second scan signal becomes the off-level before the first scan signal changes to the off-level.

7. The organic light emitting display device of claim 1, wherein the data driving unit comprises:
an initializing switch supplying the reference voltage to the reference line;
a switch sampling a voltage of the source electrode of the driving TFT as a sensing voltage when a predetermined voltage is applied to the gate electrode of the driving TFT for an external compensation and a current flows through the driving TFT;
an analog-to-digital converter converting the sampled sensing voltage into a digital sensing value; and
a digital-to-analog converter converting digital data to be supplied to the sub-pixel into the data voltage.

8. The organic light emitting display device of claim 7, wherein the data to be supplied to the sub-pixel is modulated based on the digital sensing value in order to compensate for a change of a threshold voltage of the driving TFT.

9. The organic light emitting display device of claim 8, wherein the change of the threshold voltage of the driving TFT is detected in a non-display section immediately from when a driving power is applied to when an image is displayed or a non-display section immediately from when the image display ends to when the driving power is cut off, and the compensation of the change of the threshold voltage of the driving TFT and the change of the mobility of the driving TFT are performed during an image display section.

10. An organic light emitting display device comprising a display panel including a plurality of pixels, each pixel including sub-pixels each having an organic light emitting diode (OLED), a driving TFT controlling a driving current flowing through the OLED, a first switch TFT applying a data voltage to a gate electrode of the driving TFT, a second switch TFT applying a reference voltage to a source electrode of the driving TFT, and a storage capacitor connected between the gate electrode and the source electrode of the driving TFT, comprising:
a data driving unit outputting the data voltage to a data line connected to the sub-pixels, and outputting the reference voltage to a reference line connected to the sub-pixels; and
a gate driving unit outputting signals to a first gate line connected to the gate electrode of the first switch TFT and a second gate line connected to the gate electrode of the second switch TFT;
a timing controller temporally separating a sensing driving from a display driving, wherein the sensing driving senses driving characteristics of the sub-pixels and updating compensation values according to the sensed characteristics and the display driving displays the input image reflecting the compensation values according to a predetermined control sequence,
wherein the first gate line controls supply of the data voltage and the second gate line controls the reference voltage, and two adjacent sub-pixels emitting a same color and neighboring in a direction in which the data line advances are supplied with the data voltage through different data lines and share the first and second gate lines to compensate for a driving characteristic of the driving TFT of the sub-pixels.

11. The organic light emitting display device of claim 10, wherein the sensing driving is performed during vertical blank periods while the display driving is performed, or during a power-on sequence period before the display driving is started, or during a power-off sequence period after the display driving is finished.

12. The organic light emitting display device of claim 11, wherein the vertical blank period is a period in which input image data is not written, and is arranged between two vertical active periods in each of which input image data for one frame is written.

13. The organic light emitting display device of claim 11, wherein the sensing driving is performed when the display device is in a standby mode, a sleep mode, or a low power mode.

14. The organic light emitting display device of claim 10, wherein the plurality of pixels include an internal compensation circuit.

15. The organic light emitting display device of claim 10, wherein the internal compensation circuit includes one or more switch TFTs and one or more capacitors to initialize the gate of the driving TFT and senses the threshold voltage and mobility of the driving TFT to compensate the data voltage.

16. The organic light emitting display device of claim 10, wherein the two adjacent sub-pixels emitting different colors are supplied with the data voltages though a same channel.

17. The organic light emitting display device of claim 16, wherein the data driving unit comprises a demux switching unit including first, second, third and fourth demux switches, wherein the first and second demux switches select one of the two adjacent sub-pixels emitting different colors and the third and fourth demux switches select one of the two adjacent sub-pixels emitting the same color when the data driving unit applies the data voltages output from the channel to the data lines.

18. The organic light emitting display device of claim 17, wherein the first and second demux switches are controlled by signals having a duty ratio of 50% and a period of one horizontal period and in opposite phases to each other, and the third and fourth demux switches are controlled by signals having a duty ratio of 50% and a period of two horizontal periods and in opposite phases to each other.

19. The organic light emitting display device of claim 10, wherein a first scan signal applied to the first gate line maintains on-level and a second scan signal applied to the second gate line maintains off-level during a sensing period, during which a source voltage of the driving TFT rises toward a data voltage applied to the gate electrode of the driving TFT, and the first and second scan signals maintain off-level during an emission period, during which the OLED emits light according to a driving current programmed in the sensing period in order to compensate for a change of mobility of the driving TFT.

20. The organic light emitting display device of claim 19, wherein the first and second scan signals become the on-level in synchronization with a start of a first horizontal period, the first scan signal becomes the off-level before a second horizontal period ends, and the second scan signal becomes the off-level before the first scan signal changes to the off-level.

* * * * *